(12) United States Patent
Schaetz et al.

(10) Patent No.: US 11,652,022 B2
(45) Date of Patent: May 16, 2023

(54) POWER SEMICONDUCTOR DEVICE AND METHOD

(71) Applicant: Infineon Technologies AG, Neubiberg (DE)

(72) Inventors: Josef Schaetz, Neukirchen v.W (DE); Dethard Peters, Hoechstadt (DE); Stephan Pindl, Ergoldsbach (DE); Hans-Joachim Schulze, Taufkirchen (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/944,325

(22) Filed: Jul. 31, 2020

(65) Prior Publication Data

US 2021/0035882 A1 Feb. 4, 2021

(30) Foreign Application Priority Data

Jul. 31, 2019 (DE) .......................... 102019120692.8

(51) Int. Cl.
*H01L 23/373* (2006.01)
*H01L 29/423* (2006.01)
(Continued)

(52) U.S. Cl.
CPC .......... *H01L 23/373* (2013.01); *H01L 23/367* (2013.01); *H01L 29/0696* (2013.01);
(Continued)

(58) Field of Classification Search
CPC ............... H01L 29/0696; H01L 29/401; H01L 29/7802; H01L 29/66333; H01L 29/66712;
(Continued)

(56) References Cited

U.S. PATENT DOCUMENTS 6,246,076 B1 * 6/2001 Lipkin .................. H01L 21/045
257/77
7,622,763 B2 * 11/2009 Suda ................ H01L 21/28158
257/315
(Continued)

FOREIGN PATENT DOCUMENTS

| CN | 109686667 A | 4/2019 |
| DE | 112006000151 B4 | 1/2010 |
| JP | 2015128082 A | 7/2015 |

OTHER PUBLICATIONS

Song et. al., "Two-Dimensional Materials for Thermal Management Applications", Joule, 2, pp. 442-463 (Year: 2018).*

(Continued)

*Primary Examiner* — Bilkis Jahan
*Assistant Examiner* — Victor V Barzykin
(74) *Attorney, Agent, or Firm* — Murphy, Bilak & Homiller, PLLC

(57) ABSTRACT

A power semiconductor device includes: a semiconductor body having a front side and a backside and configured to conduct a load current between the front side and the backside; and a plurality of control cells configured to control the load current. Each control cell is at least partially included in the semiconductor body at the front side and includes a gate electrode that is electrically insulated from the semiconductor body by a gate insulation layer. The gate insulation layer is or includes a first boron nitride layer.

21 Claims, 12 Drawing Sheets

(51) Int. Cl.

| | | |
|---|---|---|
| *H01L 29/51* | (2006.01) | |
| *H01L 29/06* | (2006.01) | |
| *H01L 29/40* | (2006.01) | |
| *H01L 29/16* | (2006.01) | |
| *H01L 29/78* | (2006.01) | |
| *H01L 23/367* | (2006.01) | |
| *H01L 29/66* | (2006.01) | |
| *H01L 29/739* | (2006.01) | |

(52) U.S. Cl.
CPC ........ *H01L 29/1608* (2013.01); *H01L 29/401* (2013.01); *H01L 29/42364* (2013.01); *H01L 29/513* (2013.01); *H01L 29/518* (2013.01); *H01L 29/66333* (2013.01); *H01L 29/66712* (2013.01); *H01L 29/7395* (2013.01); *H01L 29/7802* (2013.01)

(58) Field of Classification Search
CPC ............. H01L 29/7395; H01L 29/7393; H01L 29/66325; H01L 23/373; H01L 23/367; H01L 29/518; H01L 29/42364
See application file for complete search history.

(56) References Cited

U.S. PATENT DOCUMENTS

| | | | |
|---|---|---|---|
| 8,350,270 B2* | 1/2013 | Watanabe | H01L 29/0878 257/77 |
| 9,000,448 B2* | 4/2015 | Hamamura | H01L 29/7802 257/77 |
| 9,209,262 B2* | 12/2015 | Tanaka | H01L 29/1608 |
| 9,704,956 B2* | 7/2017 | Shepard | H01L 29/0665 |
| 10,211,301 B1* | 2/2019 | Shimizu | H01L 29/7813 |
| 10,468,496 B2* | 11/2019 | Hisada | H01L 29/7811 |
| 2004/0094840 A1* | 5/2004 | Sakamoto | H01L 21/76829 257/758 |
| 2005/0258491 A1* | 11/2005 | Bojarczuk | H01L 29/518 257/369 |
| 2005/0269634 A1* | 12/2005 | Bojarczuk | H01L 21/28088 257/338 |
| 2006/0148151 A1* | 7/2006 | Murthy | H01L 21/02639 438/197 |
| 2006/0175672 A1* | 8/2006 | Matsushita | H01L 21/318 257/410 |
| 2008/0135954 A1* | 6/2008 | Ohmi | H01L 29/6606 257/411 |
| 2011/0108994 A1 | 5/2011 | Liang et al. | |
| 2012/0171850 A1* | 7/2012 | Honaga | H01L 29/66068 438/478 |
| 2014/0017883 A1* | 1/2014 | Dal | H01L 21/28518 438/478 |
| 2014/0027783 A1* | 1/2014 | Yin | H01L 21/823821 257/77 |
| 2014/0167073 A1* | 6/2014 | MacMillan | H01L 21/02164 257/77 |
| 2014/0210008 A1* | 7/2014 | Oritsuki | H01L 29/0619 257/362 |
| 2014/0361353 A1* | 12/2014 | Yin | H01L 29/66492 257/288 |
| 2015/0061078 A1* | 3/2015 | Abel | H01L 21/02488 257/618 |
| 2015/0086460 A1* | 3/2015 | Kim | C23C 18/1245 423/290 |
| 2015/0097226 A1* | 4/2015 | Lichtenwalner | H01L 29/66333 257/329 |
| 2016/0087064 A1* | 3/2016 | Ohashi | H01L 29/42364 257/77 |
| 2016/0281221 A1* | 9/2016 | Kim | C23C 16/56 |
| 2016/0380090 A1* | 12/2016 | Roberts | H01L 29/402 257/76 |
| 2017/0256569 A1* | 9/2017 | Ohara | H01L 27/1251 |
| 2018/0076291 A1 | 3/2018 | Koyama et al. | |
| 2018/0166554 A1* | 6/2018 | Hisada | H01L 21/02271 |
| 2018/0219055 A1 | 8/2018 | Bu et al. | |
| 2018/0226480 A1 | 8/2018 | Okuda et al. | |
| 2019/0115443 A1 | 4/2019 | Ramdani | |
| 2019/0157270 A1* | 5/2019 | Matsumoto | H01L 29/78684 |
| 2019/0157272 A1* | 5/2019 | Oishi | H01L 29/66795 |
| 2020/0211839 A1* | 7/2020 | Salahuddin | H01L 21/28194 |
| 2020/0219980 A1* | 7/2020 | Shimizu | H01L 29/1095 |

OTHER PUBLICATIONS

Jeong. et. al., "Wafer-scale and selective-area growth of high-quality boron nitride on Ni (111) by metal-organic chemical vapor deposition", Scientific Reports, 9:5736 (Year: 2019).*

Jeon et. al., "Improvement in interfacial characteristics of low-voltage carbon nanotube transistor with solution-processed nitride thin films", Applied Surface Science, 413, pp. 118-122 (2017) (Year: 2017).*

Park, Seongjun , et al., "Formation of Hexagonal Boron Nitride by Metal Atonric Vacancy-Assisted B-N Molecular Diffusion", ACS nano, vol. 9, No. 1, 2015, 633-638.

Bao, Jie, et al., "Two-dimensional hexagonal boron nitride as lateral heat spreader in electrically insulating packaging", Journal of Physics D: Applied Physics vol. 49, May 26, 2016, 1-10.

Li, Xinxia, et al., "Thermal conduction across a boron nitride and silicon oxide interface", Journal of Physics D: Applied Physics vol. 50, Feb. 9, 2017, 1-9.

Meric, Inanc, et al., "Graphene field-effect transistors based on boron nitride gate dielectrics", IEEE 2010 International Electron Devices Meeting, 2010, 1-4.

* cited by examiner

POWER SEMICONDUCTOR DEVICE AND METHOD

TECHNICAL FIELD

This specification refers to embodiments of a power semiconductor device and to embodiments of a method of forming a power semiconductor device. In particular, this specification refers to aspects of a vertical power semiconductor device comprising a plurality of control cells, each having a gate electrode and a gate insulation layer.

BACKGROUND

Many functions of modern devices in automotive, consumer and industrial applications, such as converting electrical energy and driving an electric motor or an electric machine, rely on power semiconductor devices. For example, Insulated Gate Bipolar Transistors (IGBTs), Metal Oxide Semiconductor Field Effect Transistors (MOSFETs) and diodes, to name a few, have been used for various applications including, but not limited to switches in power supplies and power converters.

A power semiconductor device usually comprises a semiconductor body configured to conduct a load current along a load current path between two load terminals of the device. For example, in case of a vertical power semiconductor device, the load current may flow between a front side and a backside of the semiconductor body.

Further, the power semiconductor device may comprise a plurality of control cells which may be arranged in a so-called active (cell) area of the power semiconductor device. For example, a load current path may be controlled by means of an insulated electrode, commonly also referred to as control electrodes or gate electrodes. Such a gate electrode may be arranged in each of the control cells. For example, upon receiving a corresponding control signal from, e.g., a driver unit, the gate electrode may set the power semiconductor device in one of a conducting state and a blocking state. In some cases, the gate electrode may have a planar design, extending mainly in a plane parallel to a front side surface of the semiconductor body. In other variants, the gate electrode may be included within a trench extending vertically into the semiconductor body from the front side surface, wherein the trench may exhibit, e.g., a stripe configuration or a needle configuration.

It is a general challenge in the design of such power semiconductor devices to provide for a sufficient heat dissipation, e.g., from positions within the device where a relatively high current densities (and hence heat production) occur during operation. For example, the creation of hot spots, which could give rise self-heating effects and could ultimately lead to the destruction of the device, should generally be avoided.

SUMMARY

Aspects described herein relate to a specific novel design of a gate insulation layer of a power semiconductor device that may, for example, yield an improved thermal performance.

According to an embodiment, a power semiconductor device comprises: a semiconductor body having a front side and a backside and being configured for conducting a load current between the front side and the backside; and a plurality of control cells being configured for controlling the load current, each control cell being at least partially included in the semiconductor body at the front side and comprising a gate electrode that is electrically insulated from the semiconductor body by means of a gate insulation layer, wherein the gate insulation layer is or comprises a first boron nitride layer.

According to a further embodiment, a power semiconductor device comprises: a semiconductor body having a front side and a backside and being configured for conducting a load current between the front side and the backside; and a dielectric layer being arranged at the front side and comprising at least one of a cubic boron nitride layer and a hexagonal boron nitride layer.

According to another embodiment, a method of forming a power semiconductor device is presented, wherein the power semiconductor device comprises: a semiconductor body having a front side and a backside and being configured for conducting a load current between the front side and the backside; and a plurality of control cells being configured for controlling the load current, each control cell being at least partially included in the semiconductor body at the front side and comprising a gate electrode that is electrically insulated from the semiconductor body by means of a gate insulation layer, wherein the gate insulation layer is or comprises a boron nitride layer. The method comprises forming the boron nitride layer by means of a deposition process.

It should be noted that in some embodiments the boron nitride layers mentioned above and in the following may be structured in a horizontal plane, i.e., if viewed from above. In other words, the respective boron nitride layer need not extend continuously in the horizontal plane, but may be interrupted.

Those skilled in the art will recognize additional features and advantages upon reading the following detailed description, and upon viewing the accompanying drawings.

BRIEF DESCRIPTION OF THE DRAWINGS

The parts in the figures are not necessarily to scale. Instead, emphasis is placed upon illustrating principles of the invention. Moreover, in the figures, like reference numerals designate corresponding parts. In the drawings.

DETAILED DESCRIPTION

Figure 1:
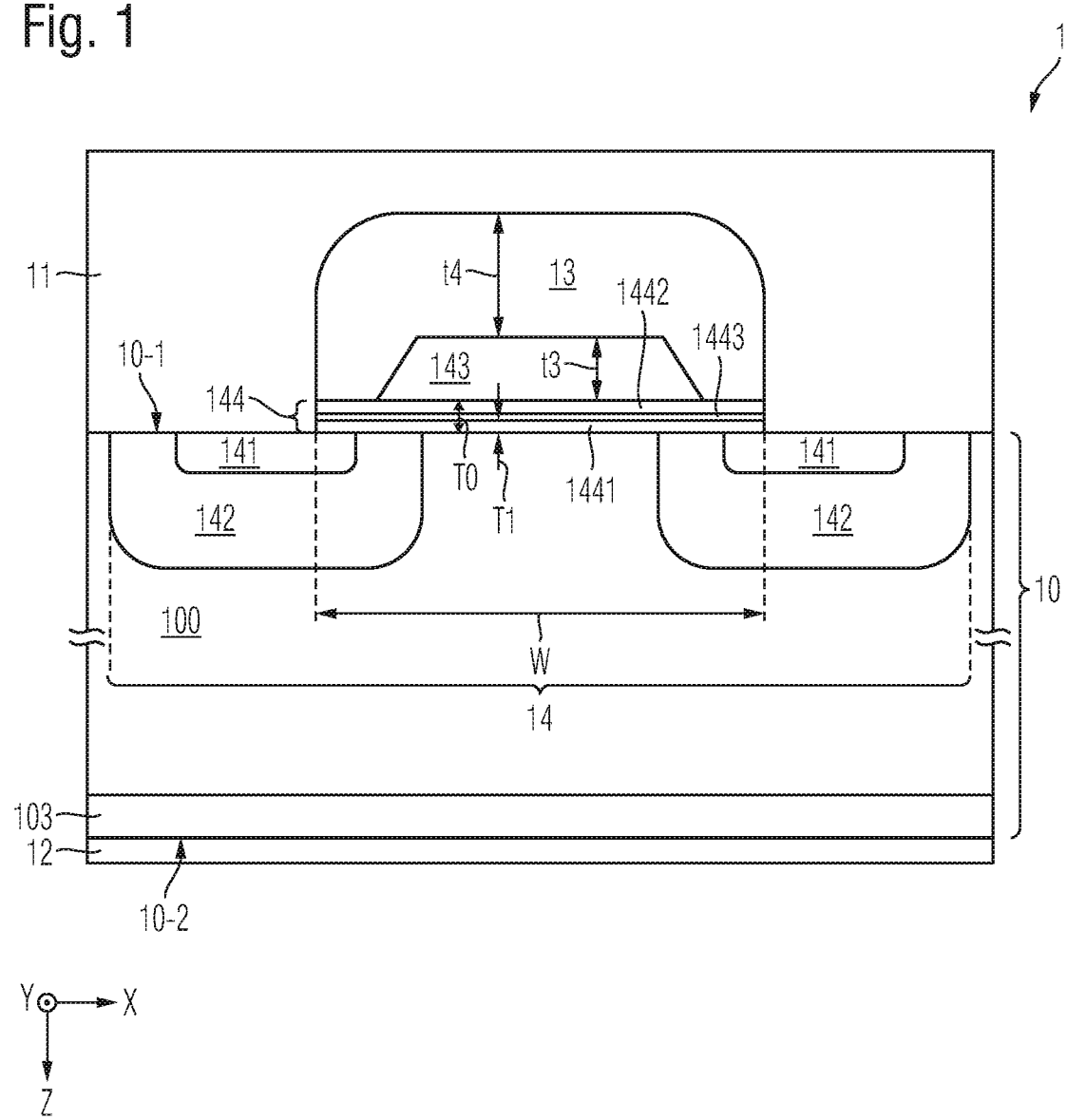
FIG. 1 schematically and exemplarily illustrates a section of a vertical cross-section of a power semiconductor device in accordance with one or more embodiments.

In the following detailed description, reference is made to the accompanying drawings which form a part hereof and in which are shown by way of illustration of specific embodiments in which the invention may be practiced.

In this regard, directional terminology, such as "top", "bottom", "below", "front", "behind", "back", "leading", "trailing", "above" etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appended claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a horizontal surface of a semiconductor substrate or of a semiconductor structure. This can be for instance the surface of a semiconductor wafer or a die or a chip. For example, both the first lateral (or horizontal) direction X and the second lateral (or horizontal) direction Y mentioned below and/or shown in the figures can be horizontal directions, wherein the first lateral direction X and the second lateral direction Y may be perpendicular to each other.

The term "vertical" as used in this specification intends to describe an orientation which is substantially arranged perpendicular to the horizontal surface, i.e., parallel to the normal direction of the surface of the semiconductor wafer/chip/die. For example, the vertical direction Z mentioned below and/or shown in the Figures may be a direction that is perpendicular to both the first lateral direction X and the second lateral direction Y.

In this specification, n-doped is generally referred to as "first conductivity type" while p-doped is referred to as "second conductivity type". Alternatively, opposite doping relations can be employed so that the first conductivity type can be p-doped and the second conductivity type can be n-doped.

In the context of the present specification, the terms "in ohmic contact", "in electric contact", "in ohmic connection", and "electrically connected" intend to describe that there is a low ohmic electric connection or low ohmic current path between two regions, sections, zones, portions or parts of a semiconductor device or between different terminals of one or more devices or between a terminal or a metallization or an electrode and a portion or part of a semiconductor device. Further, in the context of the present specification, the term "in contact" intends to describe that there is a direct physical connection between two elements of the respective semiconductor device; e.g., a transition between two elements being in contact with each other may not include a further intermediate element or the like.

In addition, in the context of the present specification, the term "electric insulation" is used, if not stated otherwise, in the context of its general valid understanding and thus intends to describe that two or more components are positioned separately from each other and that there is no ohmic connection connecting those components. However, components being electrically insulated from each other may nevertheless be coupled to each other, for example mechanically coupled and/or capacitively coupled and/or inductively coupled. To give an example, two electrodes of a capacitor may be electrically insulated from each other and, at the same time, mechanically and capacitively coupled to each other, e.g., by means of an insulation, e.g., a dielectric.

Specific embodiments described in this specification pertain to, without being limited thereto, a power semiconductor device exhibiting a single cell, a stripe cell or cellular (also referred to as "needle" or "columnar") cell configuration, e.g., a power semiconductor device that may be used within a power converter or a power supply. Thus, in an embodiment, such device can be configured to carry a load current that is to be fed to a load and/or, respectively, that is provided by a power source. For example, the power semiconductor device may comprise one or more active power semiconductor cells, such as a monolithically integrated diode cell, a derivative of a monolithically integrated diode cell (e.g., a monolithically integrated cell of two anti-serially connected diodes), a monolithically integrated transistor cell, e.g., a monolithically integrated IGBT or MOSFET cell and/or derivatives thereof. Such diode/transistor cells may be integrated in a power semiconductor module. A plurality of such power cells may constitute a cell field that is arranged with an active area of the power semiconductor device.

The term "power semiconductor device" as used in this specification intends to describe a semiconductor device on a single chip with high voltage blocking and/or high current-carrying capabilities. In other words, such power semiconductor device is intended for high current, typically in the Ampere range, e.g., up to several ten or hundred Ampere, and/or high blocking voltages, typically above 15 V, such as above 40V, more typically 100 V and above, e.g., up to at least 400 V or even more, e.g., up to at least 3 kV, or even up to 6 kV or more.

For example, the power semiconductor device described below may be a single semiconductor chip exhibiting a stripe cell configuration or a cellular cell configuration and can be configured to be employed as a power component in a low-, medium- and/or high voltage application.

For example, the term "power semiconductor device" as used in this specification is not directed to logic semiconductor devices that are used for, e.g., storing data, computing data and/or other types of semiconductor based data processing.

FIG. 1 schematically and exemplarily shows a section of a vertical cross-section of a power semiconductor device 1 in accordance with one or more embodiments. The power semiconductor device 1 comprises a semiconductor body 10 having a front side 10-1 and a backside 10-2. For example, the semiconductor body 10 may comprise or consist of a silicon-based substrate, a silicon carbide-based substrate, a gallium-based substrate or, e.g., another wide band gap semiconductor substrate.

The power semiconductor device 1 of the illustrated exemplary embodiment may be configured for conducting a load current between the front side 10-1 and the backside 10-2. In other words, the power semiconductor device 1 may be configured as a vertical power semiconductor device 1. For example, the power semiconductor device 1 may have one of an IGBT configuration and a MOSFET configuration. More generally, a power semiconductor device may also have a JFET configuration or a diode configuration (not illustrated in the figures).

In accordance with the exemplary embodiment illustrated in FIG. 1, the front side 10-1 may be coupled to a first load terminal structure 11 and the backside 10-2 may be coupled to a second load terminal structure 12, such that the load current may flow between the first load terminal structure 11 and the second load terminal structure 12. E.g., FIG. 1 exemplarily shows a front side metallization 11, which may form at least a part of the first load terminal structure 11, as well as a backside metallization 12, which may form at least a part of the second load terminal structure 12.

Further, the semiconductor body 10 may include a drift region 100 of a first conductivity type (e.g. n-type), The drift region 100 may be configured for conducting the load current between the first load terminal structure 11 and the second load terminal structure 12, wherein the load current path may include additional semiconductor regions 141, 142, 103 besides the drift region 100, as will be further explained in the following.

For controlling the load current, a plurality of control cells 14 may be provided, e.g., in an active cell area of the power semiconductor device 1. The section of the vertical cross-section depicted in FIG. 1 schematically illustrates only one such control cell 14 as an example. However, it should be noted that the power semiconductor device 1 may comprise a plurality, such as hundreds or even thousands, of such control cells 14, which may be electrically connected in parallel so as to conduct and control the load current together.

For example, as schematically and exemplarily illustrated in FIG. 1, each control cell 14 may be at least partially included in the semiconductor body 10 at the front side 10-1. Each control cell 14 may comprise at least one source region 141 of the first conductivity type, the source region 141 being included in the semiconductor body 10 and being electrically connected with the first load terminal structure 11.

Further, each control cell may exhibit at least one body region 142 of a second conductivity type (e.g., p-type) that is complementary to the first conductivity type, the body region 142 being included in the semiconductor body 10 and separating the source region 141 from the drift region 100.

In the exemplary embodiment of FIG. 1, the control cell 14 comprises two such source regions 141 and two corresponding body regions 142, which share a common gate electrode 143. In this embodiment, the gate electrode 143 has a planar arrangement and extends mainly in parallel to a front side surface of the semiconductor body 10 (i.e., in parallel to the horizontal plane XY in FIG. 1). In other embodiments, the gate electrode 143 may be arranged in a vertical gate trench, as will be further explained below with reference to FIG. 6A.

The gate electrode 143 may be configured for inducing a (respective) conduction channel in the body region(s) 142 in dependence on a control signal, the conduction channel extending from the source region(s) 141 to the drift region 100. For example, the power semiconductor device 1 may comprise a gate terminal (not illustrated) for receiving such a control signal from external of the power semiconductor device 1, e.g., in the form of a gate voltage, wherein the gate terminal may be electrically connected with the gate electrode 143.

For example, the gate electrode 143 may consist of or comprise polysilicon. Alternatively, the gate electrode 143 may consist of or comprise a metal.

The gate electrode 143 may be electrically insulated from the semiconductor body 10, such as from the source region (s) 141, the body region(s) 142, and the drift region 100, by means of a gate insulation layer 144, which includes a first boron nitride layer 1443. It should be noted that ins some embodiments the gate insulation layer 144 may be a layer stack, which may comprise the first boron nitride layer 1443 in addition to further layers.

For example, in an embodiment, the first boron nitride layer 1443 may consist of or comprise hexagonal boron nitride (hBN). In another embodiment, the first boron nitride layer 1443 may consist of or comprise cubic boron nitride (cBN).

In accordance with the exemplary embodiment shown in FIG. 1, the gate insulation layer 144 may be provided in the form of a stack of, e.g., three layers 1441, 1443, 1442, wherein a first dielectric layer 1441 may be arranged on top of a front side surface of the semiconductor body 10, the first boron nitride layer 1443 may be arranged on top of the first dielectric layer 1441, and a second dielectric 1442 layer may be arranged on top of the first boron nitride layer 1443. Put differently and more generally, in an embodiment, the first boron nitride layer 1443 may be sandwiched (or embedded) in between two other dielectric layers 1441, 1442.

For example, the other dielectric layers 1441, 1442, such as the first dielectric layer 1441 and the second dielectric layer 1442 shown in FIG. 1, may be oxide layers.

More generally, in accordance with one or more embodiments, the gate insulation layer 144 may further comprise a first dielectric layer 1441 being at least partially arranged in between the first boron nitride layer 1443 and the semiconductor body 10 and/or a second dielectric layer 1442 being at least partially arranged between the first boron nitride layer 1443 and the gate electrode 143.

Regarding dimensions and further referring to the exemplary embodiment of FIG. 1, a layer thickness T (e.g., as measured along the vertical direction Z) of the gate insulation layer 144 may be in the range from 50 nm to 120 nm, for example. Further, in an embodiment, said first dielectric layer 1441 may exhibit a (e.g., vertical) layer thickness T1 in the range from, e.g., 5 nm to 10 nm.

In an embodiment in accordance with FIG. 1, a horizontal extension W of the gate insulation layer may be, for example, in the range from 6 µm to 10 µm, such as, e.g., 8 µm.

Further, in an embodiment, a vertical extension 13 of the planar gate electrode 143 may be, for example, in the range from 100 nm to 500 nm.

In an embodiment, as exemplarily and schematically illustrated in FIG. 1, the power semiconductor device 1 may further comprises an interlayer dielectric (ILD) structure 13 that is arranged at least partially between the gate electrode 143 and the front side metallization 11, The ILD structure 13 may be configured for insulating the gate electrode 143 from the front side metallization 11. For example, the interlayer dielectric structure 13 may comprise one or more dielectric layers, such as one or more oxide layers. The ILD structure 13 may be configured as a so-called intermediate oxide 13. A vertical layer thickness T4 of the intermediate dielectric structure 13 (as measured in a portion extending above the gate electrode 143) may be in the range from 0.5 μm to 1.0 μm, for example.

Further with reference to FIG. 1, in an embodiment, the semiconductor body 10 may comprise a backside emitter region 103 of the first conductivity type or of the second conductivity type. For example, in case the power semiconductor device 1 has an IGBT configuration, a backside emitter region 103 of the second conductivity type may be provided, wherein the backside emitter region 103 may be arranged at the backside 10-2 of the semiconductor body 10 in contact with the backside metallization 12. In case the power semiconductor device 1 has a MOSFET configuration, for example, the backside emitter region 103 may be a region having dopants of the first conductivity type at a higher dopant concentration than the drift region 100. Those skilled in the art are well acquainted with the design of such backside emitter regions 103. Since such backside structures are not a focus of the present invention, they will not be described in greater detail here.

It should be noted that in some variant embodiments the boron nitride layer(s) 1443 mentioned above and in the following may be structured in a horizontal plane XY, i.e., if viewed from above. In other words, the respective boron nitride layer 1443 need not extend continuously in the horizontal plane, but may be interrupted.

In that case it may be provided that the boron nitride layer 1443 reaches at least to a position where it makes contact with the front side metallization 11, such as in a contact hole, so as be able to efficiently drain heat via the metal 11.

Further, in a variant embodiment, the boron nitride layer 1443 may exhibit small holes or recesses (not illustrated), such that the boron nitride layer 1443 is wedged in between the dielectric layers 1441, 1442, As a result, the cohesion of the layer stack 1441, 1442, 1443 may be improved.

Figure 2:
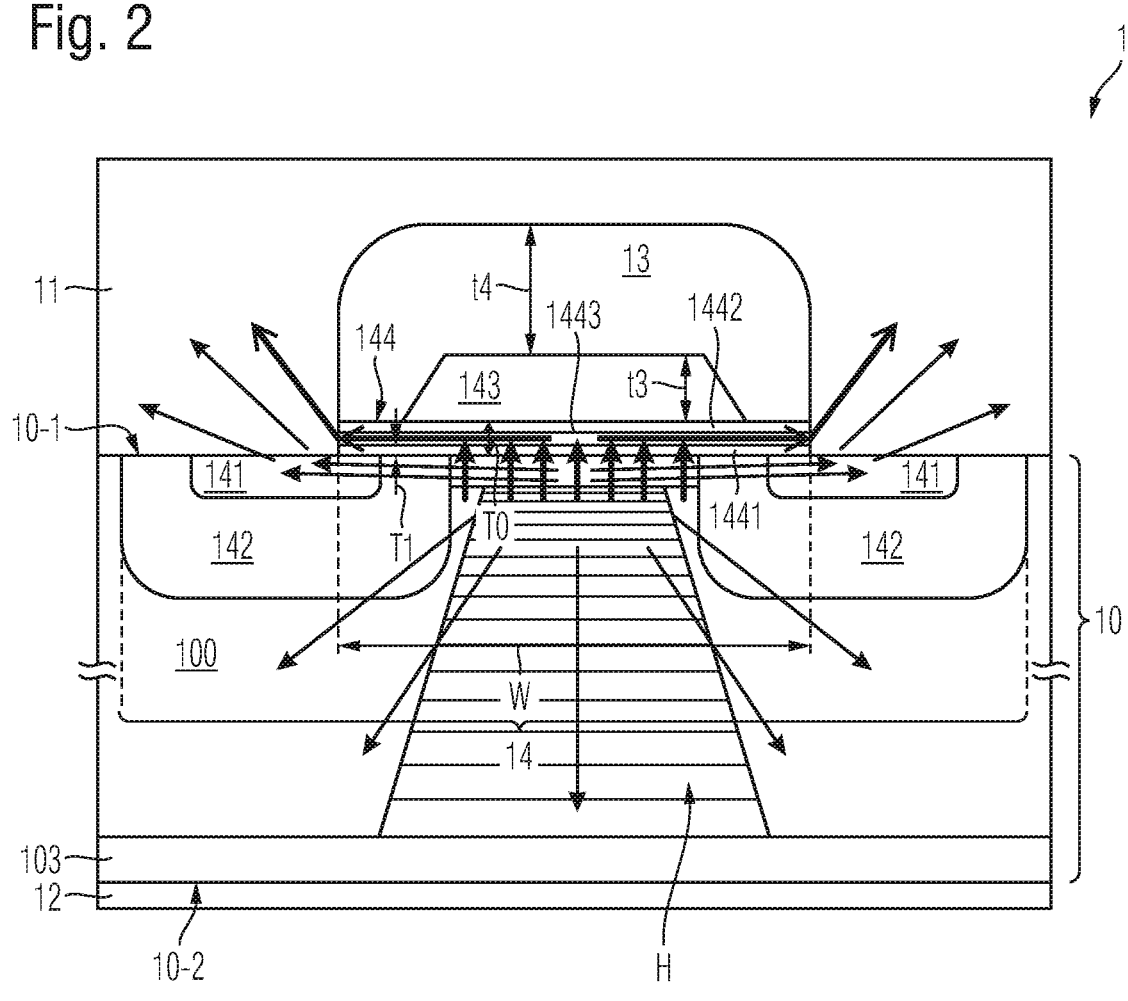
FIG. 2 schematically and exemplarily illustrates heat conduction paths during operation of the power semiconductor device of FIG. 1.
Figure 2:
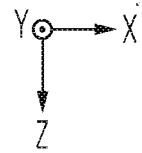

FIG. 2 schematically and exemplarily illustrates heat conduction paths during operation of the power semiconductor device 1 of FIG. 1. For example, in operation heat is produced by a current density, which may be relatively high in a region directly below the gate insulation layer 144. For example, a lot of heat may be generated at central position (with regard to the first horizontal direction X) below the first dielectric layer 1441, as well as at an interface between the first dielectric layer 1441 and the body region 142, where an inversion channel may be formed during operation, Such regions may also be referred to as hot spots.

A resulting heat profile H is schematically shown in FIG. 2, wherein a high density of the horizontal lines shall indicate a large heat, and vice versa. The thin arrows in FIG. 2 indicate paths along which the heat is dissipated, e.g., through a portion of the semiconductor body 10. The thick arrows indicate additional heat dissipation paths that are provided by the first boron nitride layer 1443. As exemplarily illustrated, the area with the highest temperature (hot spot) may be a plane under 1441, with lateral spread into the body regions 142.

Due to a very small layer thickness T1 of the first dielectric layer 1441, the boron nitride layer 1443 may be arranged very close to the hot spot, such as in a distance of only 5-10 nm distance from the hot spot, for example. The boron nitride layer 1443 can dissipate the heat as a heat spreader towards the front side metallization 11. For example, the boron nitride layer 1443 may be as thin as 10 nm. For example, a layer thickness of the boron nitride layer 1443 may amount to at least 10 nm. In some variants, the layer thickness of the boron nitride layer may be larger and may, for example, amount to the full thickness T0 of the gate insulation layer 144. This will be explained further below with reference to FIG. 3.

Accordingly, the first boron nitride layer 1443 may serve as a heat spreader which may conduct heat that is created in the semiconductor body 10, e.g., in the center of a control cell 14, to a metal, such as the front side metallization 11, such that the heat can more easily dissipate. It should be noted in this context that in the exemplary embodiment of FIGS. 1 and 2 the first boron nitride layer 1442 is (laterally) in contact the front side metallization 10, which may further facilitate the heat dissipation to the metal 11.

Figure 3:
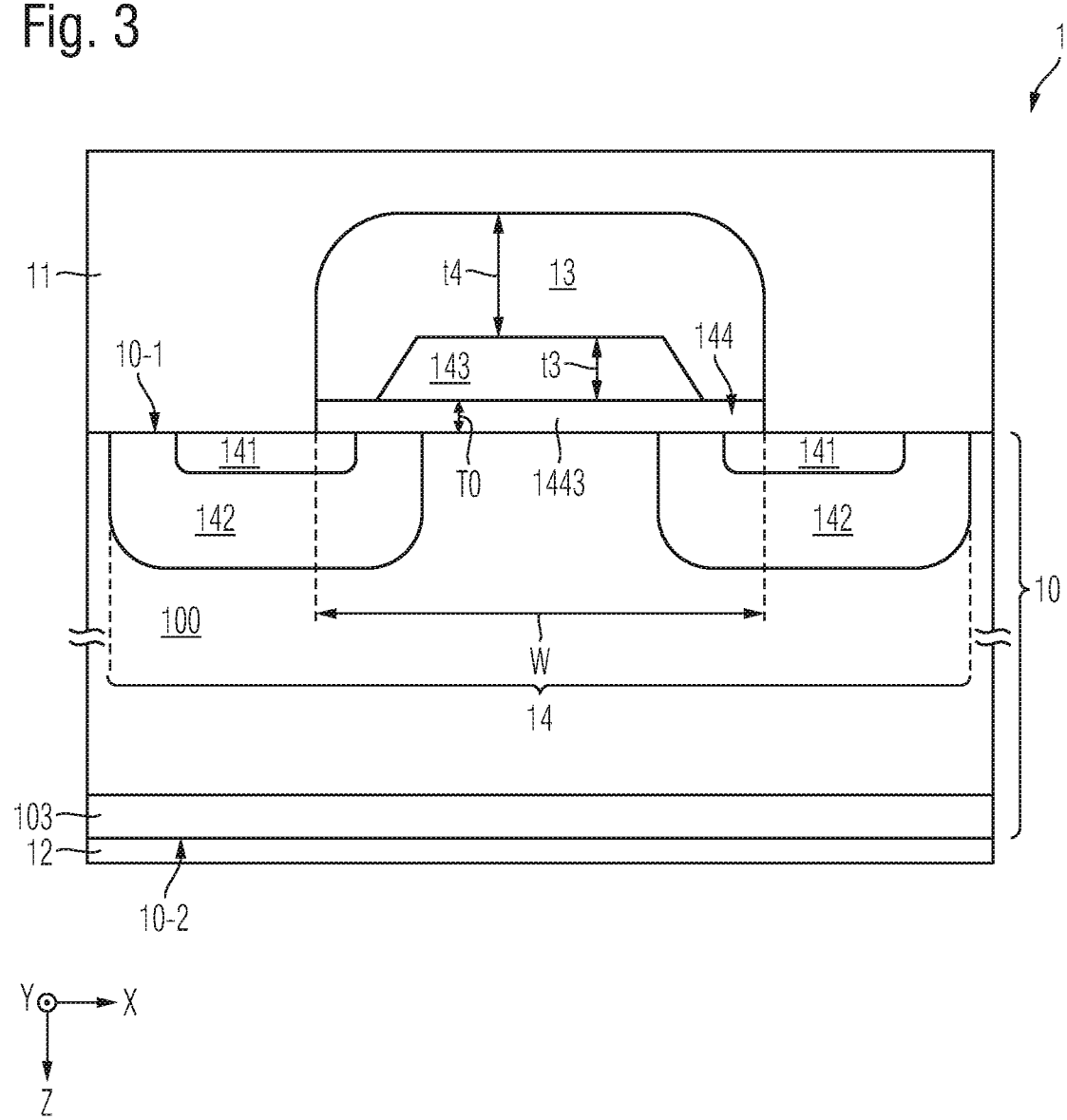
FIG. 3 schematically and exemplarily illustrates a section of a vertical cross-section of a power semiconductor device in accordance with one or more embodiments.

Referring now to FIG. 3, in a variant embodiment of the power semiconductor device 1, the gate insulation layer 144 may entirely consist of the first boron nitride layer 1443. Hence, in this embodiment, the first boron nitride layer 1443 may be arranged in contact with the semiconductor body 10 (such as with the source region(s) 141, the body region(s) 142, and the drift region 100) as well as with the gate electrode 143. Clearly, also in this embodiment, the first boron nitride layer 1443 may be in contact with the front side metallization 11. Regarding possible dimensions, it is referred to what has been stated above, e.g., about the (vertical) layer thickness T0 of the gate insulation layer 144.

Figure 4:
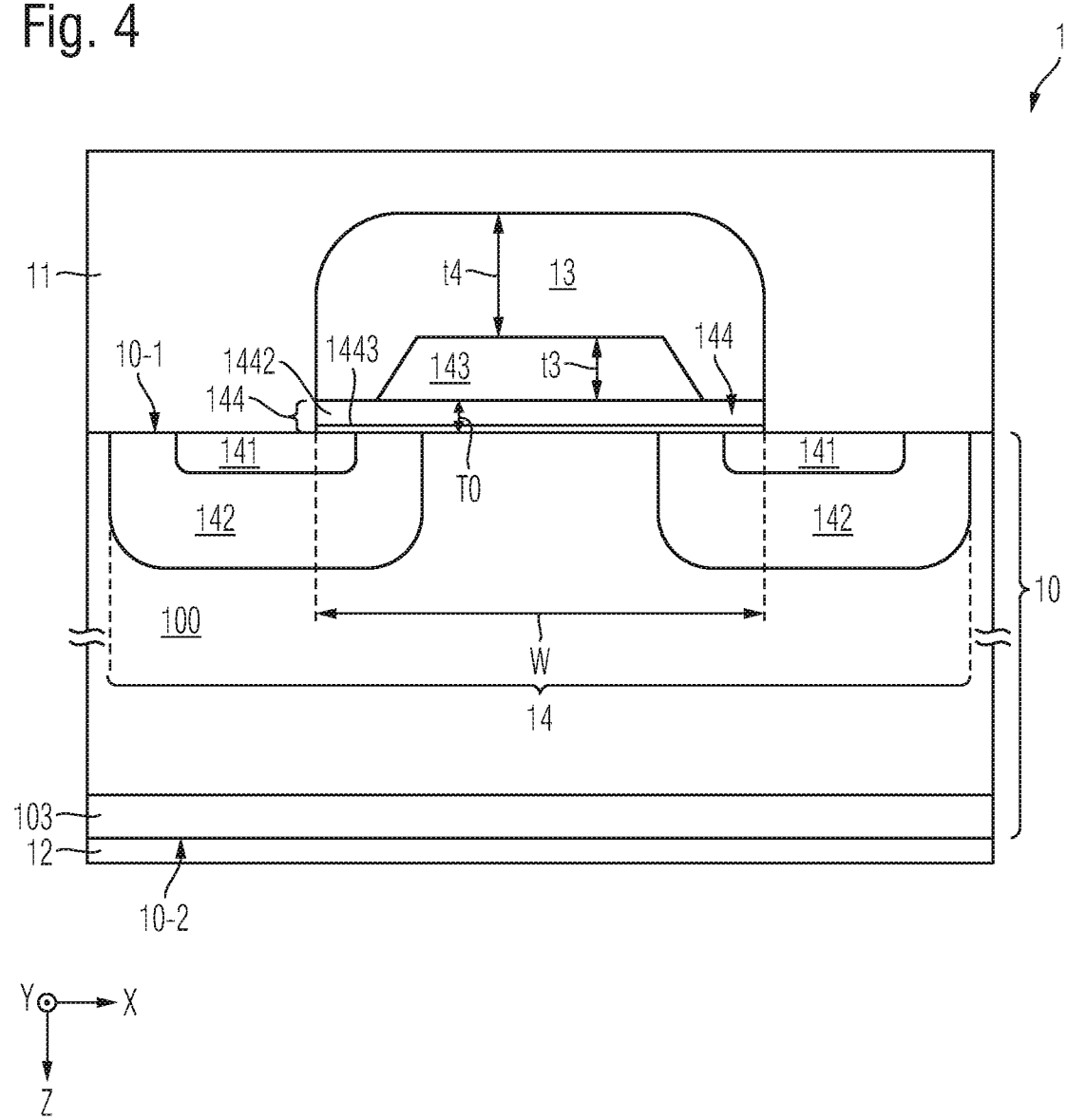
FIG. 4 schematically and exemplarily illustrates a section of a vertical cross-section of a power semiconductor device in accordance with one or more embodiments.

FIG. 4 schematically and exemplarily illustrates yet another variant embodiment. In this case, the gate insulation layer 144 comprises the first boron nitride layer 1443, which is arranged in contact with the semiconductor body 10, and a second dielectric layer 1442 that is arranged on top of the first boron nitride layer 1443. For example, the heat dissipation during operation may be very efficient due to the direct contact of the first boron nitride layer 1443 with a hot spot in the semiconductor body 10. The second dielectric layer 1442 may separate the first boron nitride layer 1443 from the gate electrode 143 and the ILD structure 13, as illustrated. For example, a thermal conductivity of the gate insulation layer 144 may be mainly defined by the thickness of the boron nitride layer 1443. Further, a dielectric strength of the gate insulation layer may 144 be mainly defined by the thickness of the second dielectric layer 1442. In principle, the dielectric strength of the gate insulation layer 144 may be improved by the second dielectric layer 1442 (in case the boron nitride has a lower dielectric strength than the material of the second dielectric layer, e.g., silicon dioxide). Also in this variant, the first boron nitride layer 1443 may be in contact with the front side metallization 11, as illustrated.

Figure 5:
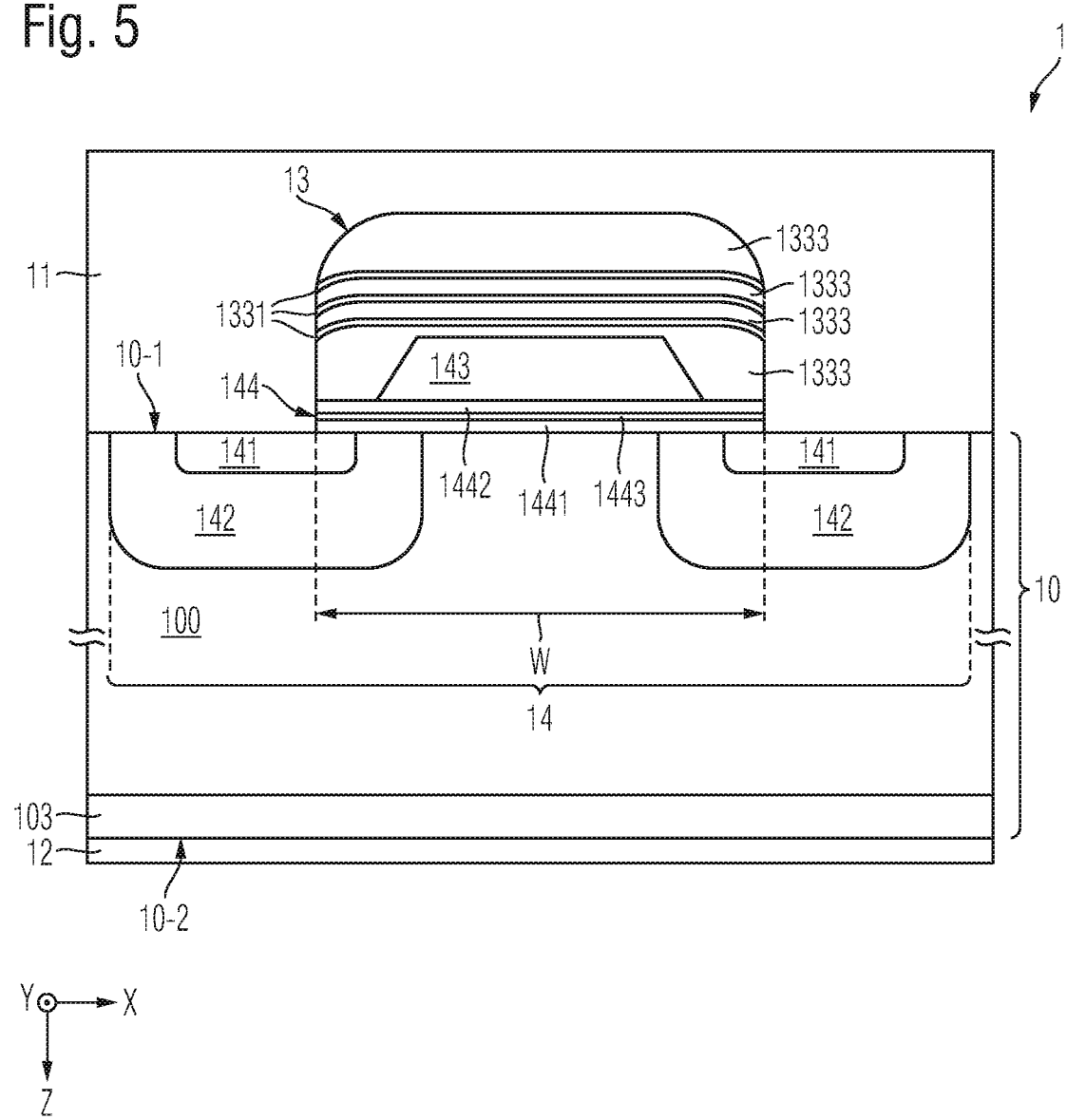
FIG. 5 schematically and exemplarily illustrates a section of a vertical cross-section of a power semiconductor device in accordance with one or more embodiments.

For example, the exemplary embodiment of FIG. 5 differs from the power semiconductor device 1 explained above with reference to FIG. 1 only in the design of the ILD structure 13. As illustrated, for example, one or more second boron nitride layer(s) 1331 may be embedded in the ILD structure 13. For example, the second boron nitride layer(s) 1331 may extend mainly in a horizontal plane XY, such as essentially in parallel to the front side surface of the semiconductor body 10. Further, it should be noted that the second boron nitride layer(s) 1331 may be arranged in contact with the front side metallization 11, as illustrated.

In an embodiment, at least two of such second boron nitride layers 1331, such as three second boron nitride layer 1311 as exemplarily illustrated in FIG. 5, may be provided as part of the ILD structure 13. For example, each of the second boron nitride layers 1311 may be sandwiched between other dielectric layers 1333 of the ILD structure 13, such as oxide layers 1333. For example, such a further dielectric layer 1333 may be arranged between the at least two second boron nitride layer 1311, as illustrated in FIG. 5.

In yet a further embodiment, the entire ILD structure 13 may consist of boron nitride. For example, such a configuration may exhibit to a horizontal cross-section as shown in one of FIGS. 1-4, wherein the ILD structure 13 is entirely formed by a boron nitride layer.

Figure 6A:
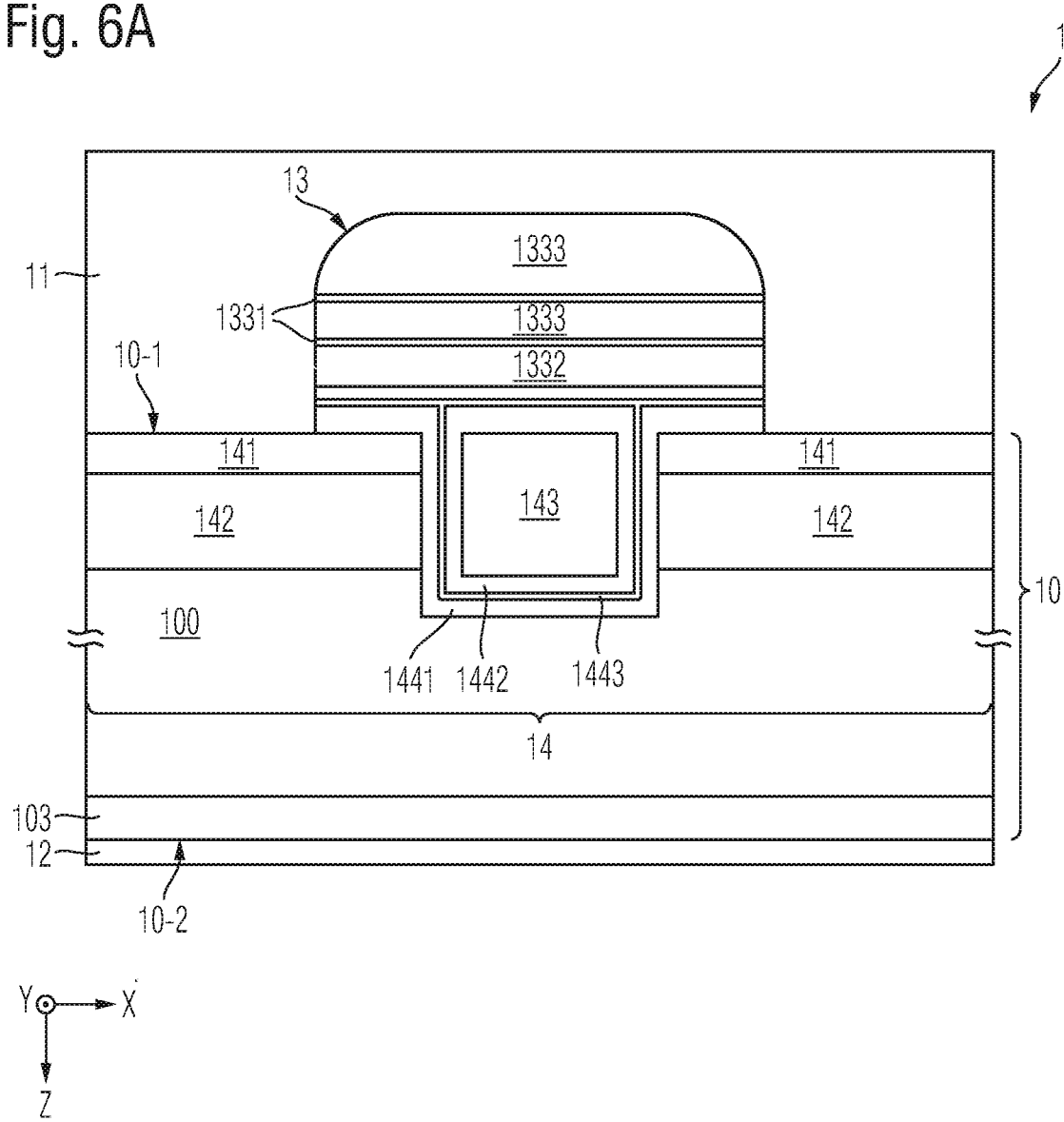
FIG. 6A schematically and exemplarily illustrates a section of a vertical cross-section of a power semiconductor device in accordance with one or more embodiments.

The exemplary embodiment shown in FIG. 6A differs from the embodiments discussed above with reference to FIGS. 1-5 mainly in that the gate electrode 143 does not have a planar configuration, but is arranged inside a gate trench extending vertically into the semiconductor body 10 from the front side surface 10-1. The gate trench may exhibit, e.g., a stripe configuration or a cellular configuration with a plurality of separate trench cells having a rectangular or quadratic outline.

A gate insulation stack 144 comprising a first boron nitride layer 1443, similar to the one described above with reference to FIG. 1, is arranged at the trench bottom and at the trench side walls. In the illustrated exemplary embodiment of FIG. 6A, a portion of the gate insulation stack 144 also extends above the gate electrode 143 as well as above a portion of the front side surface of the semiconductor body 10. For example, a (e.g. lateral) contact between the first boron nitride layer 1443 and the front side metallization 11 may thus be established, as illustrated.

In a variant embodiment (not illustrated), the power semiconductor device 1 may have a trench gate configuration as illustrated in FIG. 6A, wherein the gate insulation layer 144 may entirely consist of the first boron nitride layer 1443, similar to the embodiment described above with reference to FIG. 3.

In another variant (not illustrated), the power semiconductor device 1 may have a trench gate configuration as illustrated in FIG. 6A, wherein the gate insulation layer 144 may comprise the first boron nitride layer 1443, which is arranged in contact with the semiconductor body 10, and a second dielectric layer 1442 that separates the first boron nitride layer 1443 from the gate electrode 143 and the ILD structure 13, similar to the embodiment describe above with reference to FIG. 4.

Further, as exemplarily shown in FIG. 6A, an ILD structure 13 may be arranged on said portion of the gate insulation stack 144 that extends above the gate electrode. For example, one or more (such as at least two) second boron nitride layers 1331 may be integrated in the ILD structure 13, as has been explained above with reference to FIG. 5 and as exemplarily illustrated in FIG. 6A.

Figure 6B:
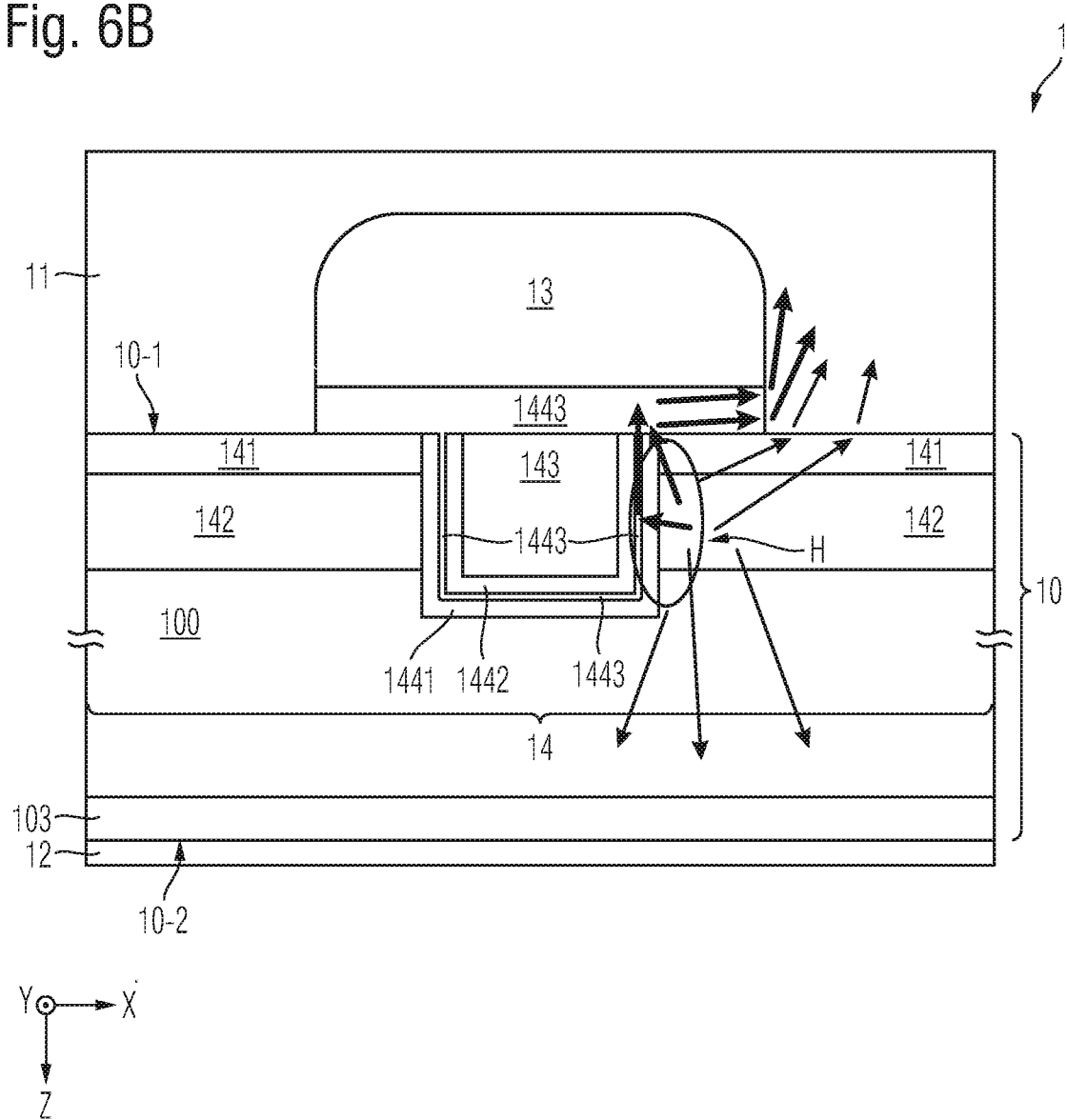
FIG. 6B schematically and exemplarily illustrates a section of a vertical cross-section of a power semiconductor device in accordance with one or more embodiments, including heat conduction paths during operation.

FIG. 6B schematically and exemplarily illustrates a section of a vertical cross-section of a power semiconductor transistor 1 having a gate trench configuration in accordance with one or more further embodiments. Further, some exemplary heat conduction paths during operation of the power semiconductor device 1 are shown. Thin arrows in FIG. 6B indicate conventional head dissipation paths through a portion of the semiconductor body 10. The thick arrows indicate additional heat dissipation paths that are provided by the boron nitride layer 1443.

In the exemplary embodiment illustrated in FIG. 6B, a part of the boron nitride 1443 is arranged above the front side surface 10-1 so as to (functionally) replace a portion of the ILD structure 13. As schematically illustrated by means of thick arrows, this may contribute to an improved dissipation of heat that is created during operation at a hotspot H which may be located adjacent to the gate trench at an interface between the first dielectric layer 1441 and the body region 142.

In the following, exemplary embodiments of a method of forming a power semiconductor device comprising a gate insulation layer 144 that includes first boron nitride layer 1443 will be explained with reference to FIGS. 7A-H.

Embodiments of the method may correspond to the embodiments of the power semiconductor device 1 described above with respect to the FIGS. 1-6B. Hence, what has been stated above may be equally/analogously applied to the power semiconductor device 1 and the method of forming a power semiconductor device 1 for forming further embodiments.

Figure 7A:
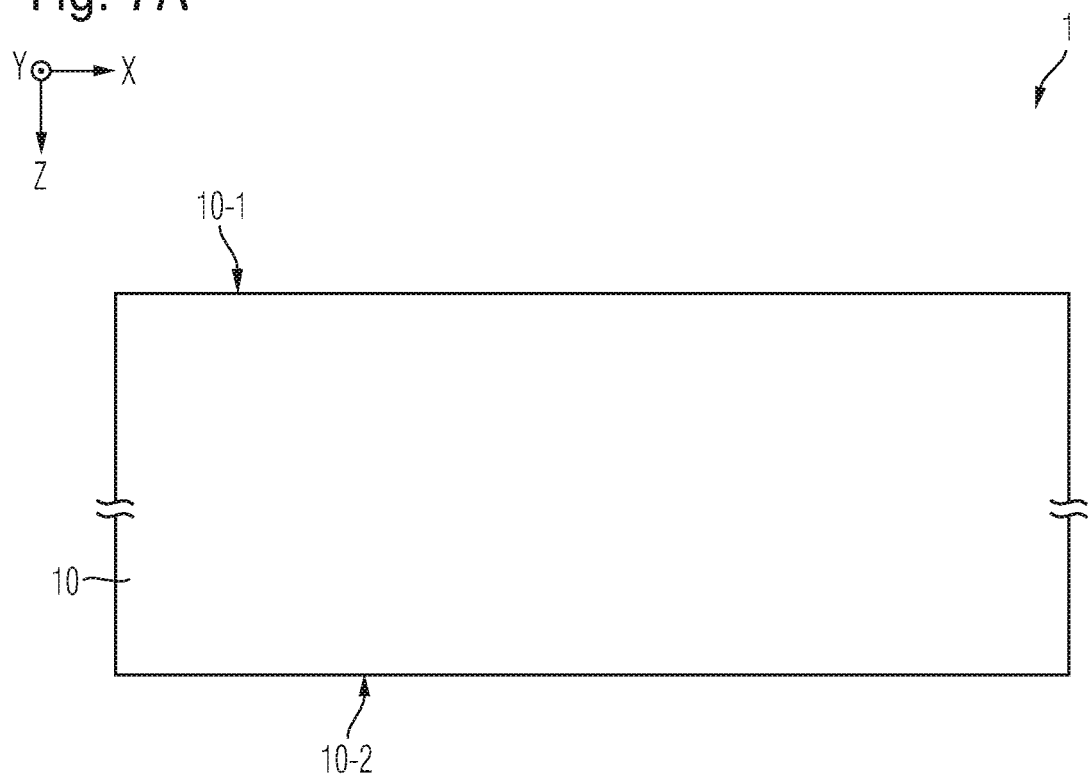
FIG. 7A-H each schematically and exemplarily illustrate steps of a method of forming a power semiconductor device in accordance with one or more embodiments.
Figure 7B:
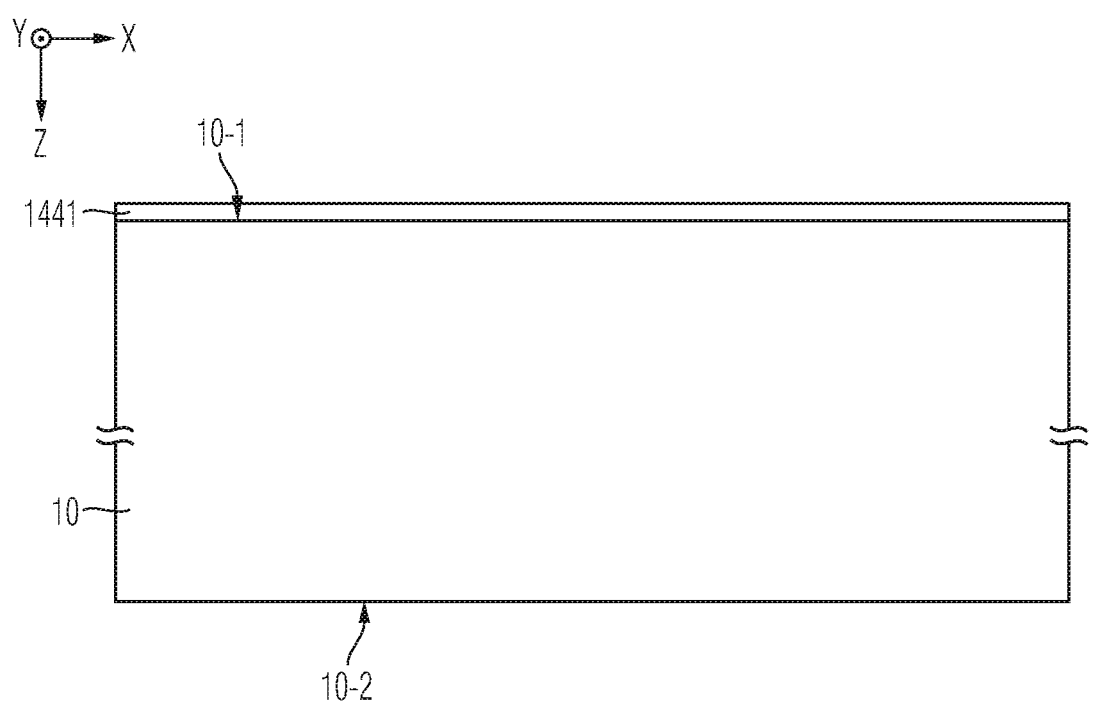

Starting with FIG. 7A, in a first step, a semiconductor body 10 having a front side 10-1 and a backside 10-2 may be provided. For example, the semiconductor body 10 may be provided in the form of a wafer, such as in the form of silicon or silicon carbide wafer substrate. The substrate 10 may exhibit a base doping, such as an n$^-$-base doping. For example, a portion of the semiconductor body 10 may later form a drift region 100 of the processed power semiconductor device 1, wherein the drift region 100 may exhibit said base doping.

In a next step (FIG. 7B), a first dielectric layer 1441 may be deposited on a front side surface of the semiconductor body 10. For example, the first dielectric layer 1441 may be formed by means of an oxide deposition on the front side surface.

Figure 7C:
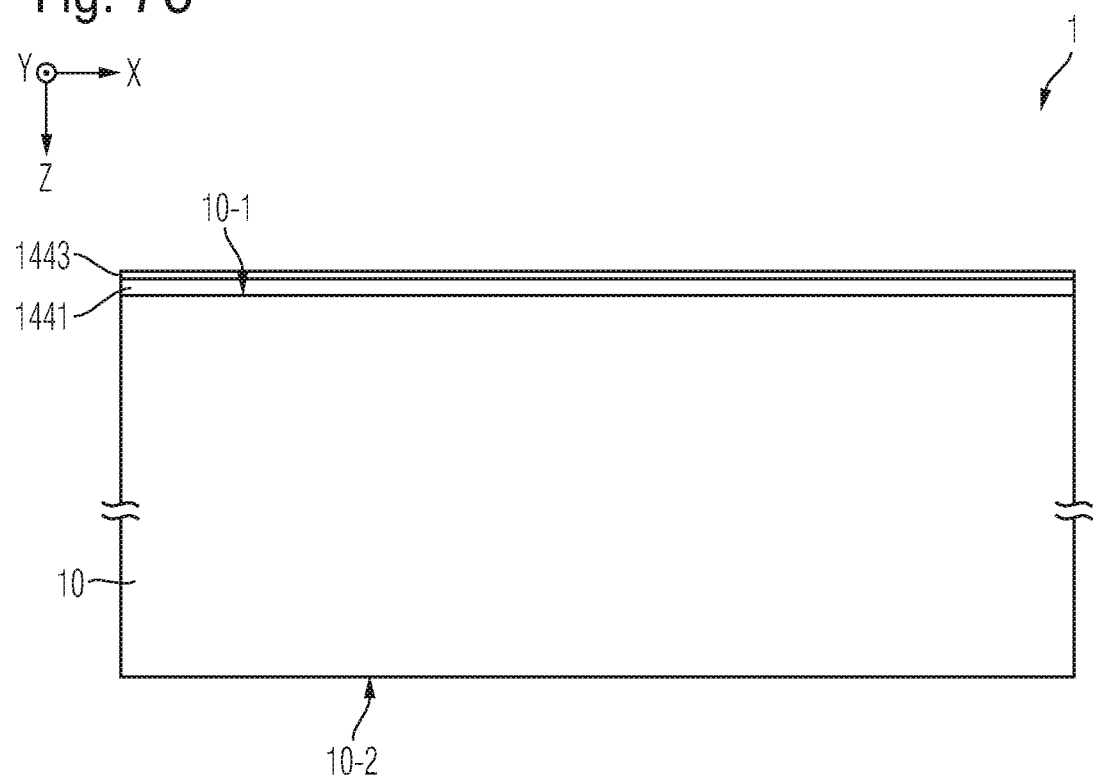
Figure 7C:
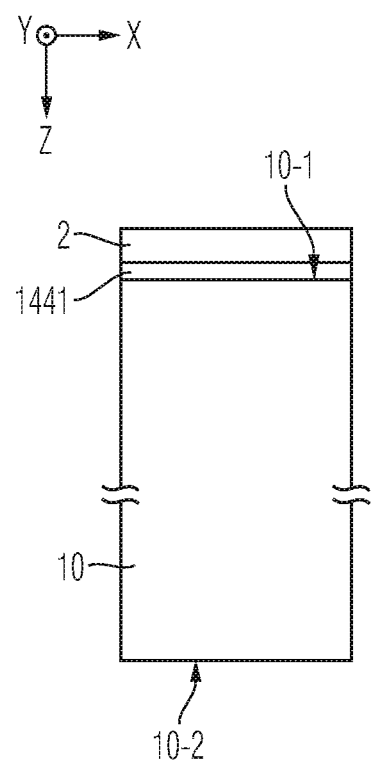
Figure 7C:
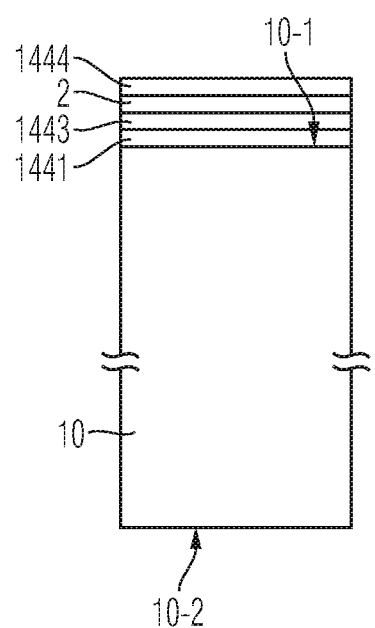
Figure 7C:
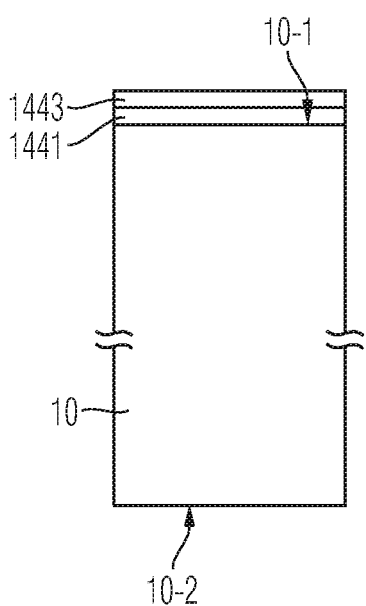

Then, a first boron nitride layer 1443 may be deposited on top of the first dielectric layer 1441 (FIG. 7C). For example, the first boron nitride layer 1443 may comprise or consist of one of a cubic boron nitride (cBN) and a hexagonal boron nitride (hBN).

Both species of boron nitride, i.e., hBN as well as cBN, have a relatively high thermal conductivity. For example, cBN may have a high thermal conductivity in all directions (i.e., isotropically), whereas hBN may exhibit a very high thermal conductivity specifically for in-layer heat propagation, i.e., along a main extension direction X, Y of the first boron nitride layer 1443, and a somewhat smaller thermal conductivity perpendicular to the main extension directions X, Y of the first boron nitride layer 1443 (i.e., along the vertical direction Z in FIG. 7O). For example, these properties of hBN and/or cBN may be exploited for controlling the direction of the heat flow. With state of the art deposition processes, cBN may be easier to deposit in trench structures than hBN.

For example, in an embodiment, cBN may be deposited by means of one or more of the following processes: A sputter process using a boron or boron nitride target; a chemical vapor deposition (CVD) process using different gases; an atomic layer deposition (ALD) process.

In another embodiment, hBN may be deposited by means of a sputter process using a boron or boron nitride target or by means of a CVD process, e.g., directly on the first dielectric layer 1441, which may be an oxide. Alternatively, an auxiliary substrate, such as a metal foil, may be provided and a hBN layer may be grown on the auxiliary substrate by means of a CVD process (not illustrated). Then, the hBN layer may be transferred to the first dielectric layer 1441, or, in case there is no first dielectric layer 1441 provided (cf. e.g. the embodiments of FIGS. 3 and 4), to the front side surface of the semiconductor body 10.

A further variant of creating the first boron nitride layer 1443 in the form of an hBN layer will now be explained with reference to FIGS. 7C(a)-7C(c): First, a metal layer 2 may be deposited on an oxide layer, such as the first dielectric layer 1441, see FIG. 7C(a). Then, by means of a CVD process, an hBN layer 1443 may be grown at an interface between the metal layer 2 and the oxide layer 1441, wherein another (upper) hBN layer 1444 may also be created on the metal layer 2 during the CVD process step, see FIG. 7C(b). Subsequently, the metal layer 2 (as well as the upper hBN layer 1444 that was created on top of the metal layer 2) may be removed so as to expose the hBN layer forming the first boron nitride layer 1443, see FIG. 7C(c).

It should be noted that in some variant embodiments the boron nitride layer 1443 may be structured in a horizontal plane XY, i.e., if viewed from above. In other words, the boron nitride layer 1443 need not extend continuously in the horizontal plane, but may be interrupted. Further, in a variant embodiment, the boron nitride layer 1443 may be formed such that it exhibits small holes or recesses (not illustrated), such that the boron nitride layer 1443 is wedged in between the dielectric layers 1441, 1442, As a result, the cohesion of the layer stack 1441, 1442, 1443 may be improved.

Figure 7D:
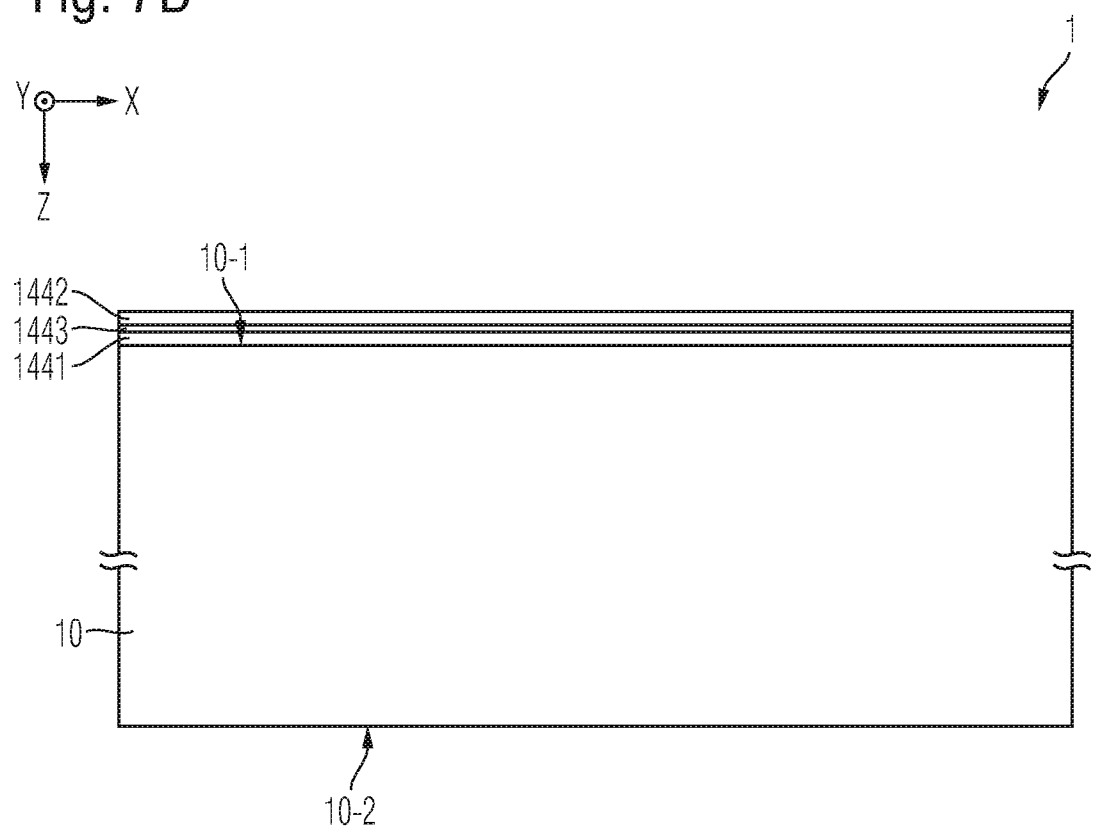

In a further step, as schematically illustrated in FIG. 7D, in an embodiment, a second dielectric layer 1442 may be formed on top of the first boron nitride layer 1443. For example, this step may be carried out by means of an oxide deposition.

Figure 7E:
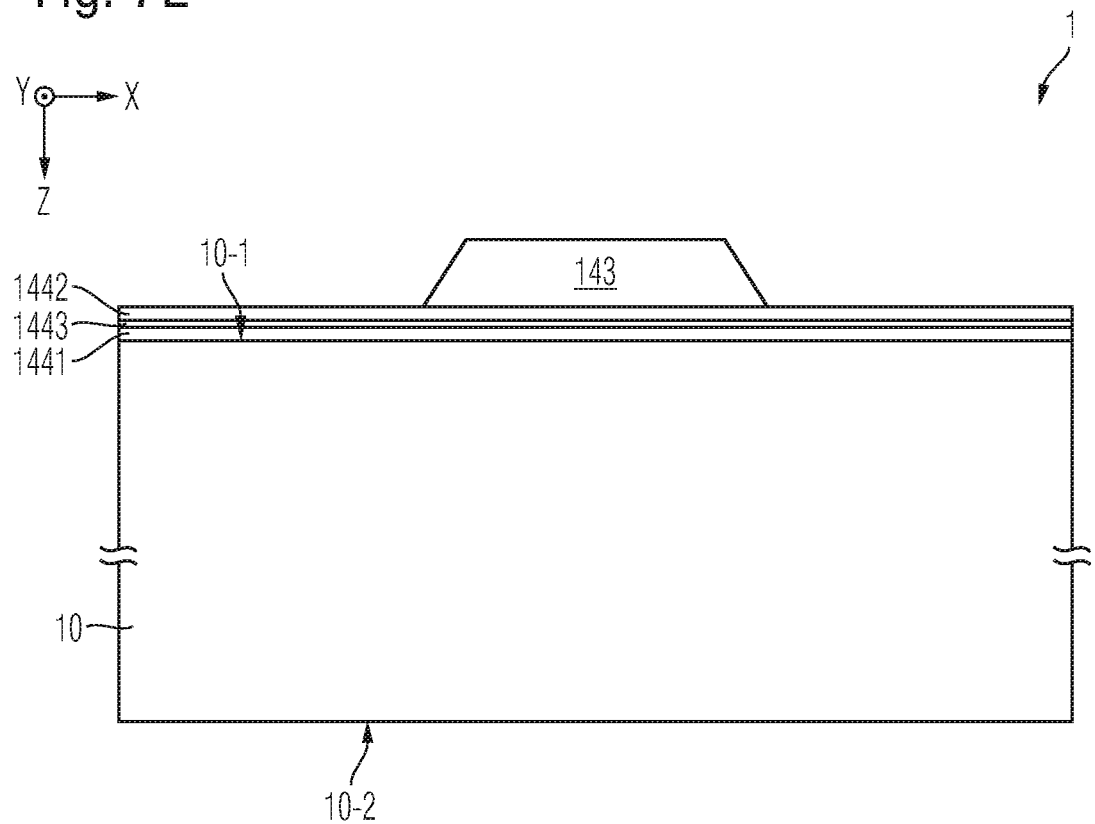

Then, as illustrated in FIG. 7E, a gate electrode 143 may be formed on top of the stack of dielectric layers 1441, 1442, 1443. It should, however, be noted that not all of the layer 1441, 1442, 1443 are necessarily required (see e.g. the embodiments according to FIGS. 3 and 4). The creation of the gate electrode 143 may comprise, for example, a deposition and subsequent structuring of a polysilicon layer, as is in principle well known in the art.

Figure 7F:
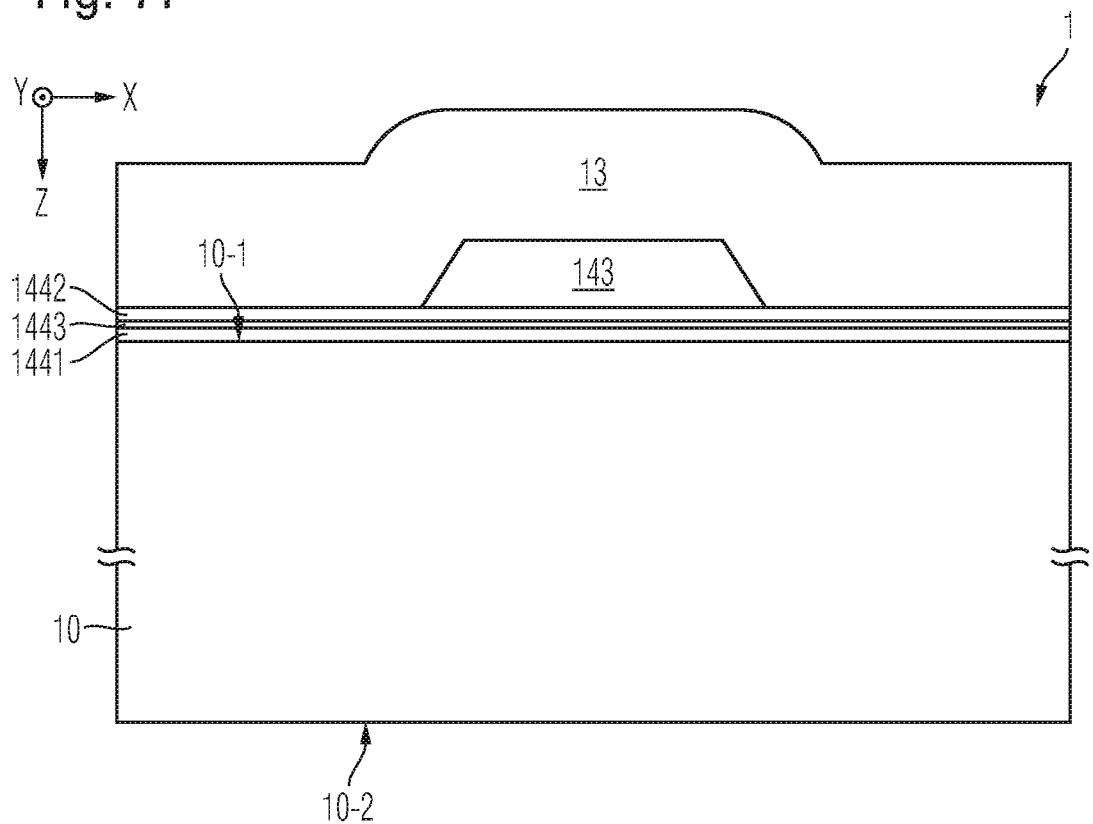
Figure 7G:
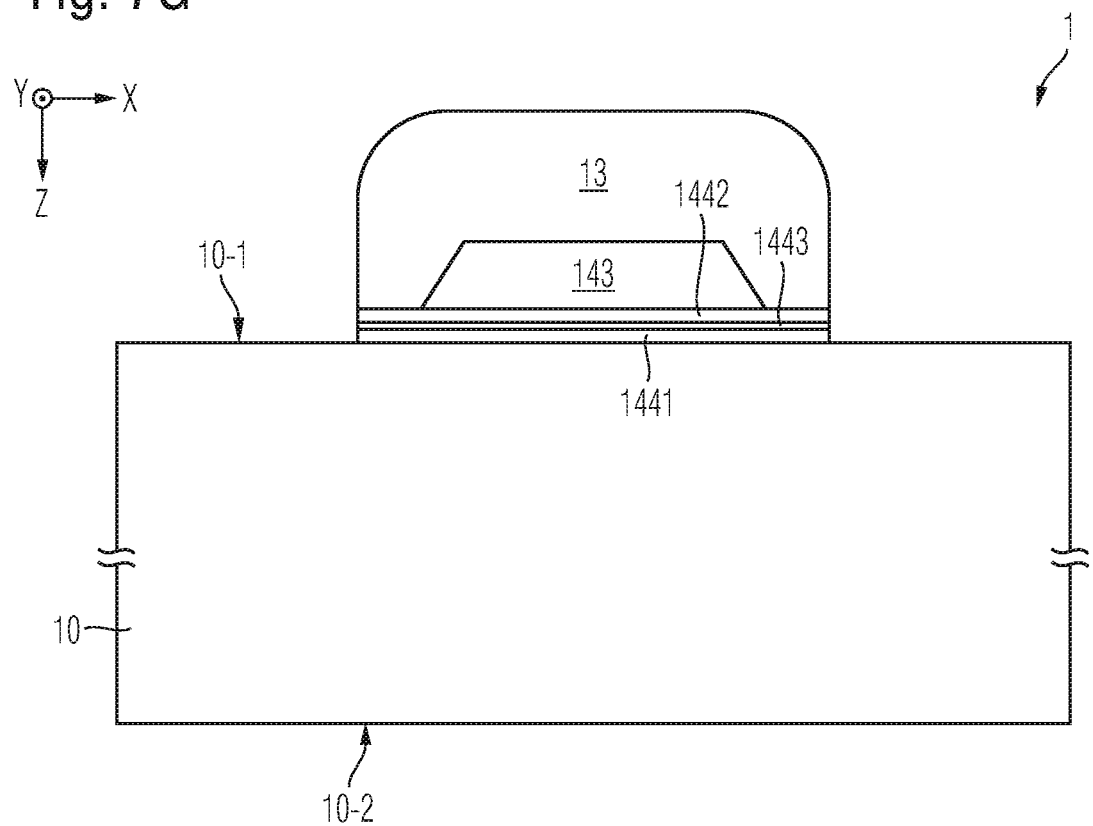

In a further step, one or more dielectric layers may be deposited and then structured by means of an etch process for forming the ILD structure 13 (FIGS. 7F-G). It should be noted that also portions of the first boron nitride layer 1443 and (if present) of the first and second dielectric layer 1441, 1442 may be removed from the semiconductor front side surface during the etch process (or during one or more further etch processes) and that, as a result, a (e.g., lateral) portion of the first boron nitride layer may be exposed.

Figure 7H:
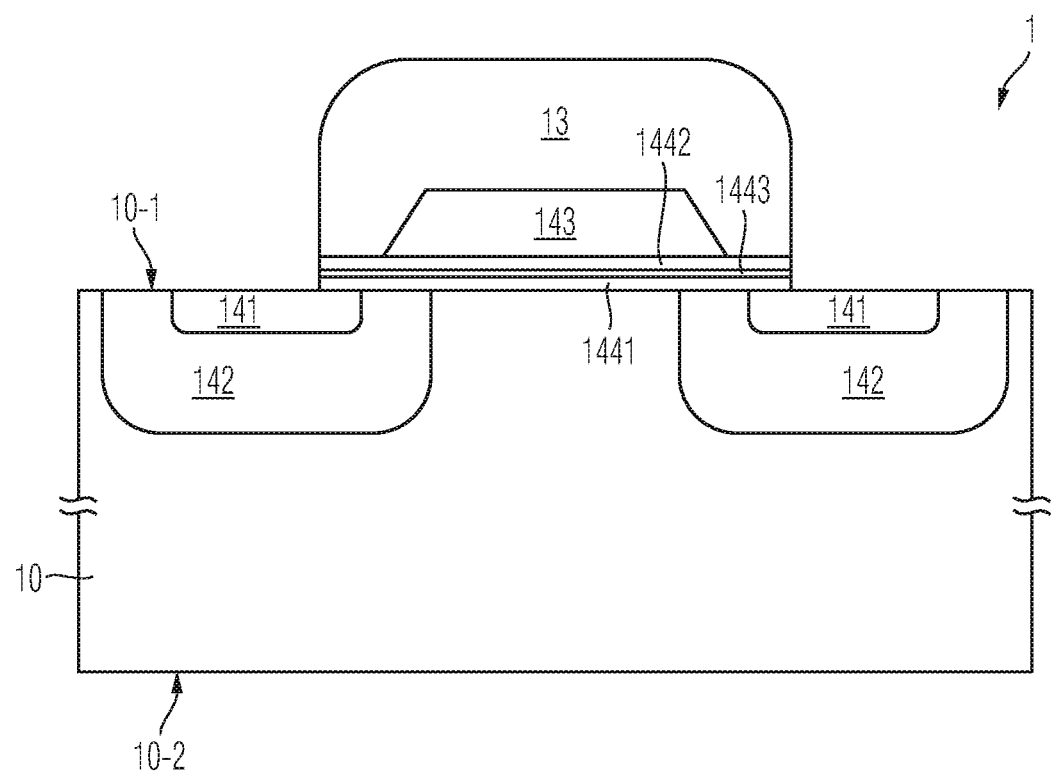
Figure 7H:
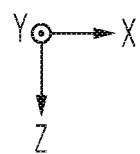

Further, as illustrated in FIG. 7H, body regions 142 and the source regions 141 may be created in the semiconductor body 10 by means of respective (masked) dopant implantation steps. For example, in case of a silicon-based power semiconductor device 1, such implantation steps may be carried out after the formation of the ILD structure 13, in accordance with FIGS. 7G-H. In case of a silicon carbide-based power semiconductor device 1, however, such implantation steps implantation steps may be carried out already at an earlier stage.

Finally, a metal may be deposited so as to form the front side metallization 11, which may be in contact with, e.g., the source regions 141, the body regions 142, as well as the first boron nitride layer 1443, see FIG. 1.

It should be noted that a power semiconductor device 1 having a trench gate configuration, as exemplarily depicted in FIGS. 6A-B, may be formed with similar process steps as the ones described above with reference to FIGS. 7A-H. For example, in this case, the method may further comprise an initial etch process for forming trenches in the semiconductor body 10. Then, a gate insulation layer 144 comprising or consisting of a first boron nitride layer 1443 may be deposited at least on the trench bottoms and trench sidewalls before the trenches are filled with a gate electrode material, such as polysilicon or metal, for forming the gate electrode 143.

In the above, embodiments pertaining to power semiconductor devices and corresponding processing methods were explained.

For example, these semiconductor devices are based on silicon (Si). Accordingly, a monocrystalline semiconductor region or layer, e.g., the semiconductor body 10 and its regions/zones, e.g., regions etc. can be a monocrystalline Si-region or Si-layer. In other embodiments, polycrystalline or amorphous silicon may be employed.

It should, however, be understood that the semiconductor body 10 and its regions/zones can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The aforementioned semiconductor materials are also referred to as "homojunction semiconductor materials". When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide ($Si_xC1-x$) and silicon-SiGe heterojunction semiconductor materials. For power semiconductor switches applications currently mainly Si, SiC, GaAs and GaN materials are used.

Spatially relative terms such as "under", "below", "lower", "over", "upper" and the like, are used for ease of description to explain the positioning of one element relative to a second element. These terms are intended to encompass different orientations of the respective device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising", "exhibiting" and the like are open ended terms that indicate the presence of stated elements or features, but do not preclude additional elements or features.

With the above range of variations and applications in mind, it should be understood that the present invention is not limited by the foregoing description, nor is it limited by the accompanying drawings. Instead, the present invention is limited only by the following claims and their legal equivalents.

The invention claimed is:

1. A power semiconductor device, comprising:
 a semiconductor body having a front side and a backside and being configured to conduct a load current between the front side and the backside; and a plurality of control cells configured to control the load current, each control cell at least partially included in the semiconductor body at the front side and comprising a gate electrode that is electrically insulated from the semiconductor body by a gate insulation layer, wherein the gate insulation layer comprises at least one of a first dielectric layer at least partially arranged in between a first boron nitride layer and the semiconductor body and a second dielectric layer at least partially arranged between the first boron nitride layer and the gate electrode.

2. The power semiconductor device of claim 1, wherein the first boron nitride layer comprises at least one of cubic boron nitride and hexagonal boron nitride.

3. The power semiconductor device of claim 1, wherein the first boron nitride layer is arranged in contact with the semiconductor body.

4. The power semiconductor device of claim 1, wherein the first boron nitride layer is arranged in contact with the gate electrode.

5. The power semiconductor device of claim 1, wherein the first boron nitride layer is arranged in contact with a metal.

6. The power semiconductor device of claim 1, wherein a layer thickness of the first dielectric layer is in the range from 5 nm to 10 nm.

7. The power semiconductor device of claim 1, wherein a layer thickness of the gate insulation layer is in a range from 50 nm to 120 nm.

8. The power semiconductor device of claim 1, wherein an interlayer dielectric structure is arranged at least partially between the gate electrode and a front side metallization of the power semiconductor device, and wherein the interlayer dielectric structure is or comprises at least one second boron nitride layer.

9. The power semiconductor device of claim 8, wherein the at least one second boron nitride layer is arranged in contact with the front side metallization.

10. The power semiconductor device of claim 8, wherein the at least one second boron nitride layer extends mainly in a horizontal plane.

11. The power semiconductor device of claim 8, wherein the interlayer dielectric structure comprises at least two second boron nitride layers, and wherein another dielectric layer is arranged between the two second boron nitride layers.

12. The power semiconductor device of claim 1, wherein the power semiconductor device is or comprises at least one of an IGBT and a MOSFET.

13. The power semiconductor device of claim 1, wherein the semiconductor body comprises silicon carbide.

14. The power semiconductor device of claim 1, wherein:
the front side is coupled to a first load terminal structure and the backside is coupled to a second load terminal structure;
the semiconductor body includes a drift region of a first conductivity type, the drift region configured to conduct the load current between the first load terminal structure and the second load terminal structure; and
each control cell comprises:

a source region of the first conductivity type included in the semiconductor body and electrically connected with the first load terminal structure;

a body region of a second conductivity type included in the semiconductor body and separating the source region from the drift region;

wherein the gate electrode is configured to induce a conduction channel in the body region in dependence on a control signal, the conduction channel extending from the source region to the drift region.

15. The power semiconductor device of claim 1, wherein the first boron nitride layer has a layer thickness of at least 10 nm.

16. The power semiconductor device of claim 1, wherein the first dielectric layer and/or the second dielectric layer comprise silicon oxide.

17. A power semiconductor device, comprising:
a semiconductor body having a front side and a backside and configured to conduct a load current between the front side and the backside; and
a dielectric layer arranged at the front side and comprising at least one of a cubic boron nitride layer having a layer thickness of at least 10 nm and a hexagonal boron nitride layer having a layer thickness of at least 10 nm.

18. A method of forming a power semiconductor device, the method comprising:
providing a semiconductor body having a front side and a backside and configured to conduct a load current between the front side and the backside;
forming a plurality of control cells configured to control the load current, each control cell at least partially included in the semiconductor body at the front side and comprising a gate electrode that is electrically insulated from the semiconductor body by a gate insulation layer, wherein the gate insulation layer is or comprises a first boron nitride layer having a layer thickness of at least 10 nm; and
forming the first boron nitride layer by a deposition process.

19. The method of claim 18, wherein forming the first boron nitride layer comprises at least one of: a chemical vapor deposition process; a sputtering process; and an atomic layer deposition process.

20. The method of claim 18, wherein forming the boron nitride layer comprises:
depositing a metal layer on an oxide layer;
growing, by a chemical vapor deposition process, a hexagonal boron nitride layer at an interface between the metal layer and the oxide layer; and
removing the metal layer to expose the hexagonal boron nitride layer.

21. The method of claim 18, wherein forming the boron nitride layer comprises:
providing an auxiliary substrate;
growing, by a chemical vapor deposition process, a hexagonal boron nitride layer on the auxiliary substrate; and
transferring the hexagonal boron nitride layer to the semiconductor body or to a dielectric layer formed on the semiconductor body.

* * * * *